United States Patent [19]

Fujiyama

[11] Patent Number: 5,038,712
[45] Date of Patent: Aug. 13, 1991

[54] APPARATUS WITH LAYERED MICROWAVE WINDOW USED IN MICROWAVE PLASMA CHEMICAL VAPOR DEPOSITION PROCESS

[75] Inventor: Yasutomo Fujiyama, Tokyo, Japan

[73] Assignee: Canon Kabushiki Kaisha, Tokyo, Japan

[21] Appl. No.: 449,054

[22] Filed: Dec. 18, 1989

Related U.S. Application Data

[63] Continuation of Ser. No. 338,334, Apr. 13, 1989, abandoned, which is a continuation of Ser. No. 94,428, Sep. 9, 1987, abandoned.

[30] Foreign Application Priority Data

Sep. 9, 1986 [JP] Japan ................... 61-212344

[51] Int. Cl.$^5$ .............................................. C23C 16/48
[52] U.S. Cl. ..................... 118/723; 118/50.1; 219/10.55 A; 333/99 PL; 333/252
[58] Field of Search .............................. 118/501, 723; 219/10.55 A; 427/45.1; 333/252, 99 PL

[56] References Cited

U.S. PATENT DOCUMENTS

| | | | |
|---|---|---|---|
| 3,594,667 | 7/1971 | Mann | 333/252 X |
| 3,728,650 | 4/1973 | Forman et al. | 333/252 |
| 4,409,520 | 10/1983 | Koike et al. | 315/39 |
| 4,456,498 | 6/1984 | Churchland | 156/275.5 |
| 4,622,447 | 11/1986 | Inoue | 427/45.1 X |
| 4,688,009 | 8/1987 | Ferguson et al. | 333/252 |
| 4,729,341 | 3/1988 | Fournier et al. | 118/723 |
| 4,732,761 | 3/1988 | Machida et al. | 427/45.1 |

FOREIGN PATENT DOCUMENTS 62-219524 9/1987 Japan .

OTHER PUBLICATIONS

Grat, R. F., "Modern Dictionary of Electronics," Sixth edition, Indianapolis, IN, Howard W. Sams & Co., Inc., 1984, pp. 256 and 954.

Primary Examiner—Evan Lawrence
Attorney, Agent, or Firm—Fitzpatrick, Cella Harper & Scinto

[57] ABSTRACT

An improved apparatus for the formation of a functional deposited film using a microwave plasma chemical vapor deposition process characterized in that a microwave transmissible dielectric material is used for the microwave introducing window, and the window has a structure wherein the dielectric material is divided into blocks of the same or different dielectric materials having a specific inductive capacity of more than 1.0. In this way it is possible to adjust not only the resonant frequency characteristics but also the electromagnetic resonant mode of the window to resonate with the microwave oscillation frequency so as to enhance microwave transmission.

37 Claims, 10 Drawing Sheets

APPARATUS WITH LAYERED MICROWAVE WINDOW USED IN MICROWAVE PLASMA CHEMICAL VAPOR DEPOSITION PROCESS

This application is a continuation of application Ser. No. 07/338,334, filed Apr. 13, 1989, now abandoned, which is a continuation of application Ser. No. 07/094,428, filed Sept. 9, 1987, now abandoned.

FIELD OF THE INVENTION

This invention relates to an apparatus using microwave plasmâ chemical vapor deposition process for the formation of a deposited film, especially a functional deposited film such as an amorphous silicon film on a substrate, which is usable especially in semiconductor devices, photosensitive devices for use in electrophotography, image input line sensors, image pickup devices, photoelectromotive force devices or the like.

BACKGROUND OF THE INVENTION

Hitherto, as the element members of semiconductor devices, photosensitive devices for use in electrophotography, image input line sensors, image pickup devices, or other electric and optical devices, there have been proposed a number of deposited films such as amorphous semiconductor films, for instance, an amorphous deposited film composed of an amorphous silicon material compensated with hydrogen atoms and/or halogen atoms such as fluorine atoms or chlorine atom [hereinafter referred to as "A-Si(H,X)"]. Some of such films have been put to practical use.

Along with those amorphous semiconductor films, there have been proposed various methods for their preparation using plasma chemical vapor deposition technique wherein a raw material is decomposed by subjecting it to the action of an energy of direct current, high frequency or microwave to thereby form a deposited film on a substrate of glass, quartz, heat-resistant resin, stainless steel or aluminum. And there have been also proposed various apparatuses for practicing such methods.

Now, in recent years, the public attention has been focused on plasma chemical vapor deposition processes by means of microwave glow discharging decomposition [hereinafter expressed by the abbreviation "MW-PCVD process"] also at industrial level.

One representative apparatus for practicing such an MW-PCVD process is a structure as shown in a schematic perspective drawing of FIG. 2(A).

In FIG. 2(A), there are shown a substantially enclosed cylindrical deposition chamber 1 having a raw material gas feeding means (not shown), a microwave introducing window 2 which is made of a dielectric material of alumina ceramics or fused silica, a wave guide 3 being electrically connected to a microwave power source (not shown), microwave 4 from said microwave power source, an exhaust pipe 5 being connected through an exhaust valve (main valve) to an exhaust apparatus (vacuum pump)(not shown), a substrate 6 onto which a deposited film is to be formed, and which is placed on a substrate supporting means having an electric heater (not shown) and a film forming space (plasma generation space) 7 having a resonant structure.

The film forming operation in the apparatus shown in FIG. 2(A) is carried out, for example, in the following way.

That is, the air in the film forming space 7 is evacuated by opening the main valve of the exhaust pipe 5 to bring about the space to a predetermined vacuum. Then the heater installed in the substrate supporting means is actuated to uniformly heat the substrate 6 to a predetermined temperature, and it is kept at that temperature.

At the same time, raw material gases, for instance, $SiF_4$ gas and $H_2$ gas in the case of forming an amorphous silicon film, are introduced through the gas feeding means respectively at a predetermined flow rate into the film forming space 7 of the deposition chamber 1 while maintaining the space at a vacuum of less than $1 \times 10^{-2}$ Torr. Successively, the microwave 4, for example, of 2.45 GHz from the microwave power source is introduced through an isolator, power monitor, stub tuner (these are not shown) then the wave guide 3 and the microwave introducing window 2 into the film forming space 7 of the deposition chamber 1.

Thus, the plasmas are generated in the film forming space 7 and cause chemical interactions resulting in formation of a deposited film on the substrate 6.

Another representative apparatus for practicing the above MW-PCVD process is a structure as shown in a schematic perspective drawing of FIG. 3(A).

In FIG. 3(A), there are shown a substantially enclosed cylindrical deposition chamber 1, a microwave introducing window 2 which is made of a dielectric material of alumina ceramics or fused silica, a wave guide 3, microwave 4 from a microwave power source (not shown), an exhaust pipe 5 which is connected through a valve means to a vacuum pump (not shown), a substrate 6' in cylindrical form being place on a substrate supporting means having an electric heater 15, film forming space 7 and a gas feeding ring pipe 16 provided with a number of gas liberation holes which is connected to gas reservoirs (not shown).

The film forming operation onto the substrate 6' in cylindrical form using the apparatus shown in FIG. 3(A) is carried out in the same way as mentioned in the case of the apparatus shown in FIG. 2(A).

By the way, in the known apparatus for the formation of a deposited film using MW-PCVD process, said plasmas generated in the film forming space 7 are ionized media comprising electrons and ion particles so that they function as a kind of conductor. Especially, in the case where plasmas are excited with a microwave power of 2.45 GHz, ion particles capable of moving follow with the oscillation having a high frequency are limited to those of a low mass such as electrons. Therefore, in the case of considering the density of the generated plasmas, it will be sufficient to have an attention on the electron density. However, when plasmas generated under such conditions that the vacuum is $2 \times 10^{-2}$ Torr and the microwave power is 200 W are such low pressure discharge plasmas as having the electron temperature ($T_e$) of about 4 electron volt (hereinafter expressed by the abbreviation "eV") and an electron density of $n_e = 10^{17} m^{-3}$, the microwave of 2.45 GHz is reflected at the plasma interface which is about 10 μm distant from the microwave introducing window so that it can not be introduced into plasmas. Because of this, the plasma density becomes decreased abruptly as the distance from the microwave introducing window increases.

In view of the above, in order to form a desired deposited film composed of an A-Si(H,X) material on a large area substrate using microwave plasmas by means of such conventional apparatus as mentioned above, it is necessary to use a microwave introducing window of a large aperture.

In that case, such microwave introducing window is to be disposed to an apparatus so as to serve as a wall of the vacuum chamber 1 in any event, so that the scale of the apparatus inevitably becomes large to invite problems in relation to the strength of the apparatus. Because of this, there will occur a necessity to make a careful consideration in designing the apparatus. In addition, there is also another problem in that the volume of the film forming space 7 becomes large accordingly whereby the utilization efficiency of a raw material gas is reduced. In this regard, even if a desired deposited film product should be produced, it will become costly.

SUMMARY OF THE INVENTION

This invention is aimed at eliminating the foregoing problems in the conventional apparatuses for the formation of a deposited film using MW-PCVD process and providing an apparatus for practicing MW-PCVD process which enables one to stably form a desirable functional deposited film which is usable as an element member for semiconductor devices, photoconductive devices of electrophotography, photosensitive devices, or other electric and optical devices at a high deposition rate.

Another object of this invention is to provide an improved apparatus for forming an A-Si(H,X) deposited film using MW-PCVD process in which the microwave introducing window is so designed using a dielectric material that its resonant state can be properly adjusted in accordance with the structure composed of the dielectric material so as to make a microwave energy to be efficiently applied into plasmas.

The present inventor has conducted extensive studies for overcoming the foregoing problems on the above mentioned conventional apparatuses and attaining the objects as described above and, as a result, has accomplished this invention on the findings as below described.

That is, it was found that, in the case where the low pressure discharge plasma (electron density $n_e = 10^{15} - 10^{17} m^3$) excited by microwave is intended to be sufficiently self-exited, both the shape of the microwave introducing window and that of the film forming space are necessary respectively to have such a structure that functions as a microwave resonator.

Another finding is that, in the case where other space than the space to form a coaxial resonant structure, for example, the opening of the exhaust pipe or the like has an opening to permit a microwave to be introduced, such space also serves to function as a part of the microwave resonator. Especially, when there exists an exhaust opening or the like within the waveguide while being maintained to be a high vacuum atmosphere, the resonant conditions becomes undesirably shifted.

On the basis of the above findings, the present inventor has tried to provide an apparatus as shown in FIG. 2(B) and FIG. 3(B) in order to overcome the foregoing problems in the above mentioned conventional apparatuses, in each of which a microwave reflecting member 8 comprising a metal plate (punched metal plate) having many punched holes (1 mm-3.58 cm) or a metal mesh plate (mesh size of 1 mm-3.58 cm) is placed on the opening of an exhaust pipe 5 into a film forming space so as to seemingly seal the opening.

While, in the case that the shape of a microwave introducing window is intended to have a resonant structure, said microwave introducing window is so designed in the way as follows;

That is, when the microwave introducing window is to be of $TE_{111}$ resonant mode and the resonant wave length $\lambda$ is to be 12.245 cm (the resonant frequency of 2.45 GHz), the size of the microwave introducing window can be determined approximately from the following formula according to the known theory of the coaxial resonator;

$$\lambda = 2\pi / \sqrt{(1.84/a\sqrt{\epsilon})^2 + (\pi/d\sqrt{\epsilon})^2}$$

(wherein the "a" represents the radius (cm) of a circular resonant window, the "d" represents the thickness (cm) thereof and the "e" represents the specific inductive capacity.)

For instance in this respect, in the case of the microwave introducing window made of alumina ceramics of 99.5% in purity (specific inductive capacity $\bar{\epsilon} = 10$), resonant conditions are satisfied when the radius a of the microwave introducing window is made to be 9.5 cm and the thickness d thereof is made to be 1.95 cm. Wherein, the length of 1.95 cm as the thickness d corresponds to a half wave length of microwave transmitting in alumina ceramics medium.

Now, the resonant state of the microwave introducing window made of alumina ceramics of 2.0 cm in thickness in the apparatus shown in FIG. 2(B) was measured. The solid line shown in FIG. 2(C) shows the results obtained as a result of the measurement of the resonant frequency characteristic.

In FIG. 2(C), a transversal axis represents the frequency (unit of GHz) and a longitudinal axis represents the reflection loss (unit of dB; hereinafter, if necessary, expressed by the abbreviation "RL"). Wherein, the reflection loss (RL) is regarded to be: $RL = -20 \log_{10} \rho$ from the reflective coefficient $\rho = V_R/V_F$ corresponding to the ratio of the reflective electric power $V_R$ (v) of microwave to the input electric power $V_F$ (v) thereof.

From the results obtained, it was found that the reflection loss of said microwave introducing window becomes the smallest value of about $-40$ dB at 2.48 GHz and the microwave at this frequency transmits efficiently, but the loss becomes about $-5$ dB at the frequency of approximately 2.45 GHz Now, it is commonly said that the oscillation frequency of an ordinary microwave oscillator of 2.45 GHz lies in the range of 2.45 GHz$\pm$30 MHz. However, it was found that in fact, the characteristic of a magnetron oscillating tube has a steep and narrow band oscillation in the range of 1 to 5 MHz at the central frequency of 2.45 GHz as shown by the broken line in FIG. 2(C).

That is, when the microwave power of 2.45 GHz is intended to transmit using the known microwave introducing window, the transmitted power will be such that lies in the oblique lined range enclosed by the solid line and the broken line as shown in FIG. 2(C). For example, in the case of inputting a microwave power of 1 KW, about 560 W thereof is reflected at the alumina window and the rest amount of only about 440 W will be introduced into the reaction chamber. In this respect, when the reflection loss at the oscillation frequency is as much greater as almost the amount of the microwave power is cut off at the microwave introducing window, the microwave power becomes impossible to be efficiently introduced into the reaction chamber.

In addition to the above, in the case of the introduced power being small, there is also a problem that it is difficult to initiate discharge itself. Further in addition, discharge is continued for a long period of time in a state where a large reflection loss occurs, that invites a problem that the alumina window is heated to an elevated temperature by the microwave energy to thereby cause a damage thereon.

From what are shown in FIG. 2(C), it can be recognized that such increase in the reflection loss according to the oscillation frequency of a microwave occurs as a result of the shift of the resonant frequency of the microwave introducing window.

As a cause that an actual frequency is shifted from the predetermined value, it is thought that manufacturing accuracy of an alumina member, that of microwave shield metal peripheral member provided with the alumina member, its surface resistance etc. are co-related.

That is, an alumina member serves as the wave guide having a larger size by $\epsilon$ than in the case of a cavity for microwave. Therefore, for example, should there be an error of only 0.5 mm in that size, it functions for microwave in the same way as in the case of a cavity wherein an error of 1.5 mm in the size exists, and because of this, it invites the occurrence of a shift in an order of MHz for the resonant frequency.

And, on the surface of the shield metal member, an electric current flows in parallel to the electric field of microwave to thereby cause a reflective wave. And, the situation of generating such reflective wave differs delicately depending upon the constituent of the metal, its surface oxidized state and its prepared state, that results in shifting the resonant frequency.

Therefore, even if microwave introducing windows are such that have the same shape and that are composed of the same materials, it is seldom that they have the same resonant frequency.

In view of the above, the above calculation formula works in fact simply for the sake of approximation.

Moreover, in addition to that ceramics not being easily treated, it is almost impossible to delicately regulate the resonant frequency by adjusting the shape thereof. Because of this, it is necessary to find a suitable means which make it possible to easily and accurately tune the oscillating frequency of a microwave.

Based on these findings, the present inventor has continued further studies focusing on the adjustment of the resonant state of a microwave introducing window, and the result has come to finding that it is possible to reversibly adjust the resonant state by properly changing the structure of the microwave transmissible dielectric material to be used for a microwave introducing window.

For example, referring to a microwave introducing window having a circular resonant structure of TE$_{111}$ resonant mode, it is possible to successively shift the resonant frequency to a high frequency side by means of piling, a plurality of alumina thin films having the same radius in the direction of microwave transmission (namely, the thicknesswise direction of the alumina). It is also possible to successively shift the resonant frequency to a low frequency side by means of arranging or successively piling a plurality of alumina blocks respectively having a small radius at the position being orthogonal to the electric lines of force and which the electric lines of force are converged within the electromagnetic mode on the plane surface. It is further possible to adjust only the reflection loss without changing the resonant frequency by means of piling the above blocks in the center of a circular alumina plate. And it has been confirmed that these adjustments of the resonant frequency can be done reversibly and repeatedly in practice.

The present invention has been completed based on the above findings. And the characteristic of the apparatus for the formation of a functional deposited film using microwave plasma chemical vapor deposition process according to the present invention resides in that the microwave transmissible dielectric material is used for the microwave introducing window, and the shape thereof is made to be such that resonates with a microwave oscillation frequency, and the window is made to have such structure wherein the dielectric material is being divided or, as occasion demands, combined additionally with another dielectric material, in the way that makes it possible to properly adjust the characteristic of the resonant frequency and the electromagnetic resonant mode.

Now, as a result of confirming the fact that the resonant frequency can be shifted by means of combining the structures composed of a dielectric material having a specific inductive capacity of more than 1.0, the present inventor has come to the result that the basis of the fact resides in the conscious adjustment of the electromagnetic mode.

Therefore, according to the basic principle of the present invention, the dielectric material to be piled on said alumina circular plate will be sufficient as long as it has a specific inductive capacity of more than 1.0, in other words, it is such that can change the electric fields. For example, in the case of using a quartz glass having a specific inductive capacity of 3.5 and having the same shape and the same arrangement as in the case of alumina, the shift amount of the resonant frequency becomes desirably small and because of this, it becomes possible to conduct the more delicate adjustment.

While, in the apparatus of the present invention, it is possible to consciously convert the electromagnetic mode subsequent to the dielectric material according to the arrangement state of said dielectric block. This means that the TE$_{11}$ mode on a circular wave guide can be converted to the TE$_{11}$ mode of a coaxial line by piling an alumina block in the center position of said circular plate to thereby make it possible to prevent the local over-heat due to the uneven distribution of the heat amount generated in the dielectric material by the microwave power and to make uniform the plasma density in the reaction chamber.

Besides, in the apparatus according to the present invention, for the microwave introducing window divisionally piled in the direction of the microwave transmission, electric charge condenses at the interface between the piled layers to cause the generation of a tiny reflection for microwave. This, however, does not prevent the microwave from being transmitted but invites the generation of multiple interferences because of the reflection wave to bring about an antireflection effect for microwave, and as a result, to decrease the reflection loss.

Further more, in the apparatus according to the present invention, the divisionally piled materials are not necessary to be the same. To appropriately combine the materials having different specific inductive capacities makes it possible to manufacture a microwave introducing window having desirable wide-band resonant frequency characteristics.

DESCRIPTION OF THE PREFERRED EMBODIMENTS

Representative embodiments of an improved apparatus for the formation of a functional deposited film using MW-PCVD process according to the present invention will now be explained in detail with reference to the drawings. The description is not intended to limit the scope of the present invention.

In FIG. 1, there are shown examples for adjusting a microwave introducing window of the foregoing known $TE_{111}$ mode among others in the apparatus for the formation of a functional deposited film using MW-PCVD process according to the present invention.

Figure 1A:
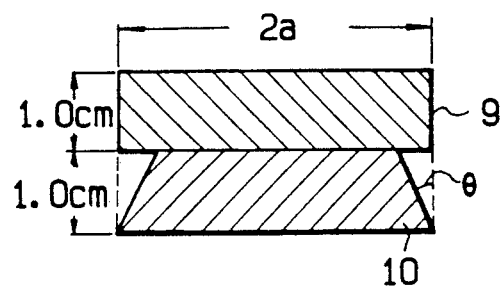
FIGS. 1(A) through 1(L) show schematic sectional or perspective views of the microwave introducing windows according to the present invention and show the frequency characteristics thereof.
Figure 1B:
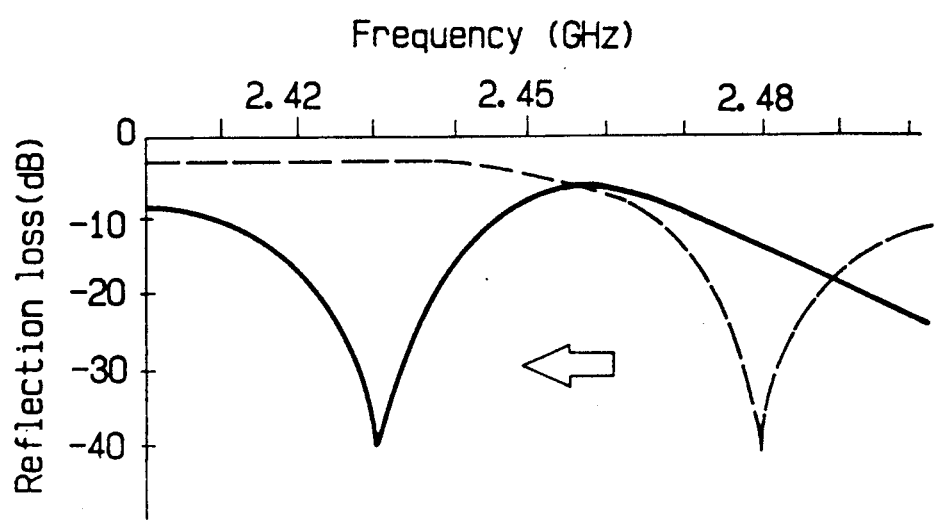

Referring to FIG. 1(A), there is shown a schematic sectional view of a known alumina window 2 comprising two alumina plates 9 and 10 of 1.0 cm in thickness respectively wherein the side wall of the alumina plate 10 on the side of plasmas being tapered. And in FIG. 1(B), there is shown its frequency characteristic, wherein the broken line represents the characteristic of the known microwave introducing window. From FIG. 1(B), it can be understood that the resonant frequency shifts to a low frequency side. The shift amount of this resonant frequency depends on the taper angle θ, which means that a large taper angle brings about a large shift amount to the low frequency side accordingly.

Figure 1C:
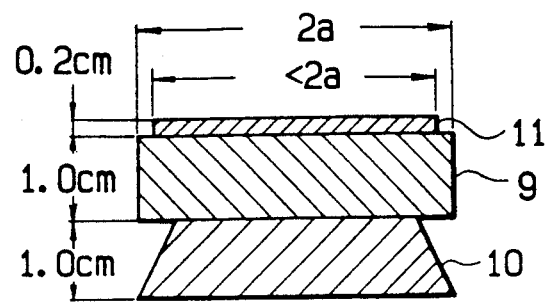
Figure 1D:
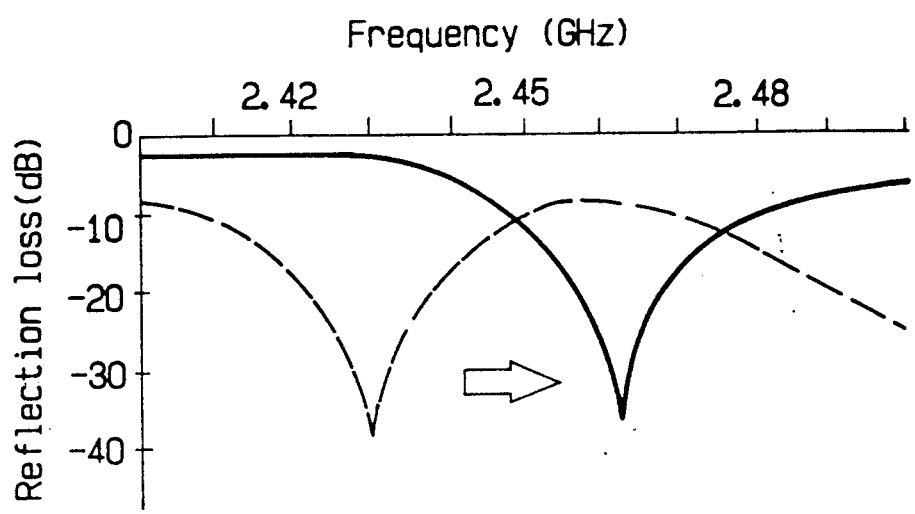
Figure 1E:
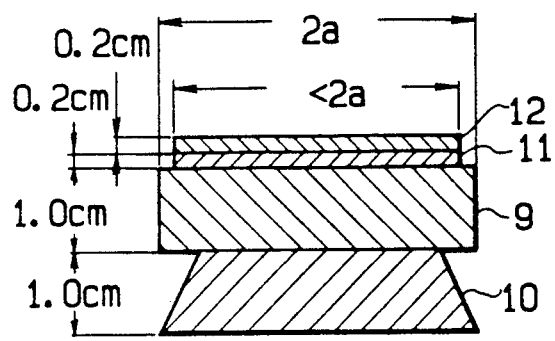
Figure 1F:
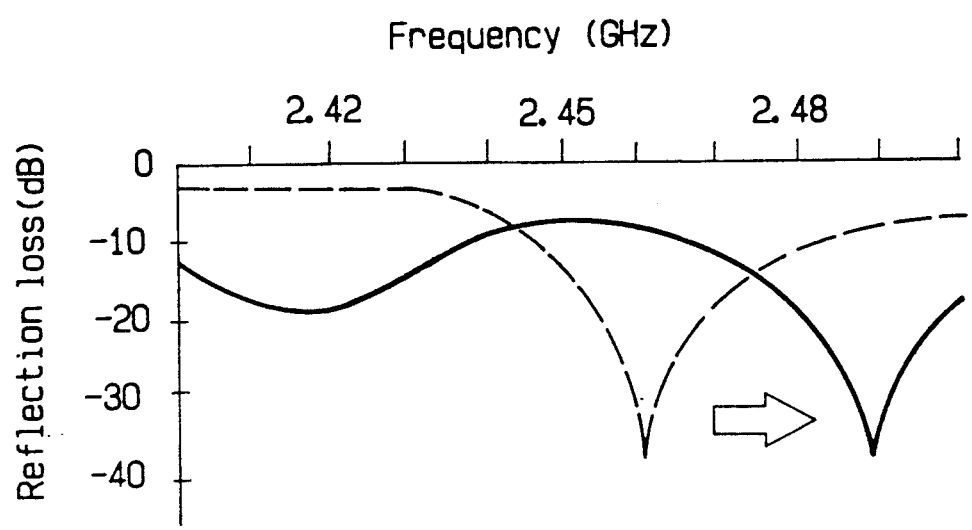

FIG. 1(C) shows a schematic sectional view of the window in which an alumina plate 11 having a thickness of 0.2 cm and a diameter of no more than 2a is piled on the alumina plate 9 shown in FIG. 1(A). And in FIG. 1(D), there is shown its frequency characteristic, wherein the broken line represents the characteristic thereof shown in FIG. 1(B) before piling the alumina plate having a thickness of 0.2 cm. According to FIG. 1(D), it can be understood that the resonant point shifts by about 30 MHz further to the high frequency side.

The case of piling one more alumina plate 12 having a thickness of 0.2 cm on said window is shown in FIG. 1 (E). Its frequency characteristic is shown in FIG. 1(F), wherein the broken line represents the characteristic thereof before this piling (i.e., the frequency characteristic of the window with one alumina plate having a thickness of 0.2 cm). From FIG. 1(F) it can be understood that the resonant point shifts by about 30 MHz further to the high frequency side.

Figure 1G:
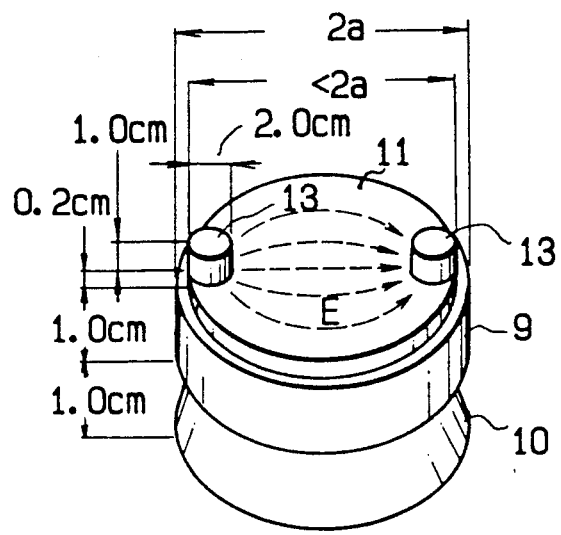

In FIG. 1(G), there is shown a schematic perspective view of the window in which alumina blocks 13 having a thickness of 1.0 cm and a diameter of 2.0 cm are arranged in two places of the window shown in FIG. 1(C) where the electric lines of force converge. In this figure, the broken line represents the distribution of the electric field E (the electric line of force). And its frequency characteristic is shown in FIG. 1(H), wherein the broken line represents the characteristic of the window shown in FIG. 1(C).

Figure 1H:
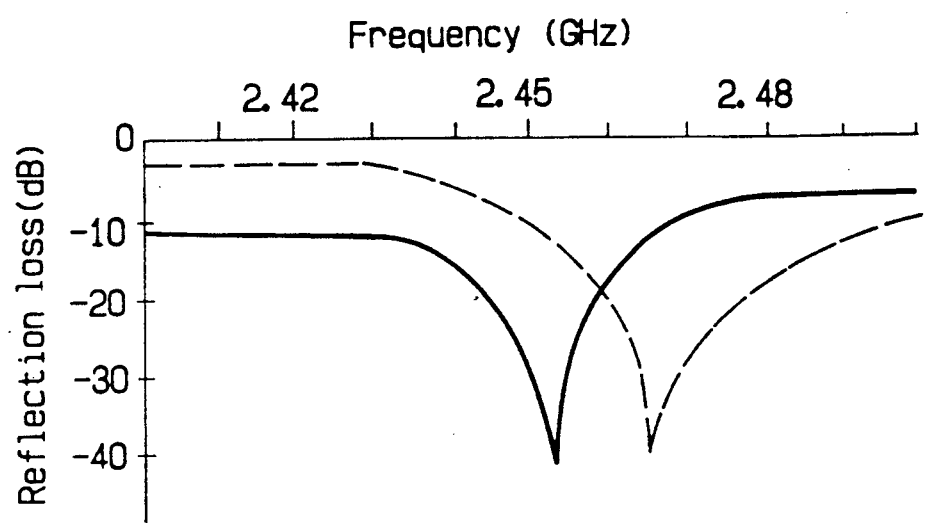

From FIG. 1(H), it can be understood that the resonant frequency shifts by about 10 MHz further to the low frequency side.

Omitting the illustration, but in the case of piling one more alumina block of 2.0 cm in diameter on each alumina block 13 of 2.0 cm in diameter arranged on the window shown in FIG. 1(G), the resonant point shifts by about 10 MHz further to the low frequency side.

Differing from the case as shown in FIG. 1(G), in the case of arranging the alumina blocks on the places where the magnetic field converges (i.e., the places where rotated by 90° in the circumferencial direction from the blocks shown in the figure), the frequency characteristic scarcely changes.

Figure 1I:
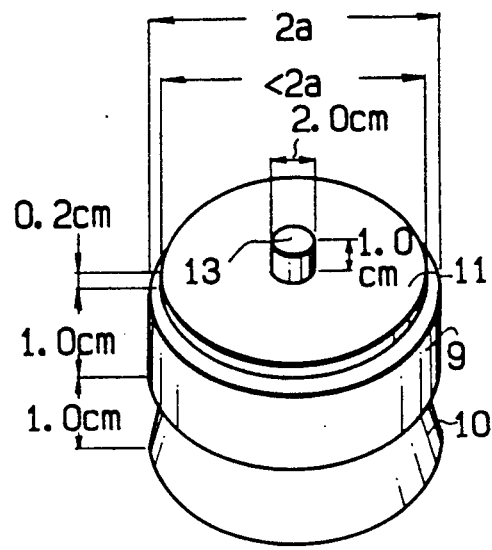
Figure 1J:
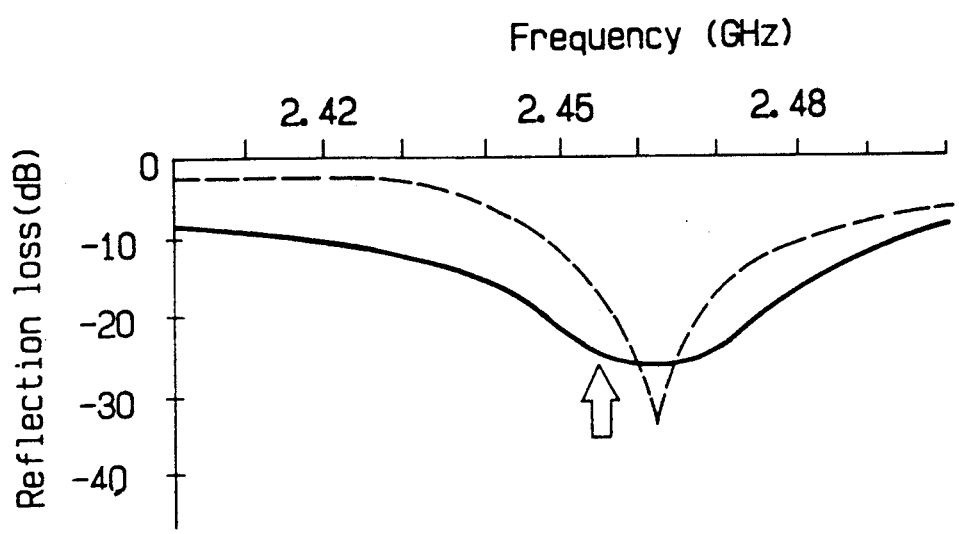

In FIG. 1(I), there is shown a schematic perspective view of the window having one alumina block 13 arranged in its center position, and its frequency characteristic is shown in FIG. 1(J). In this case, the resonant point scarcely shifts, but the reflection loss becomes larger by about 10 dB.

Figure 1K:
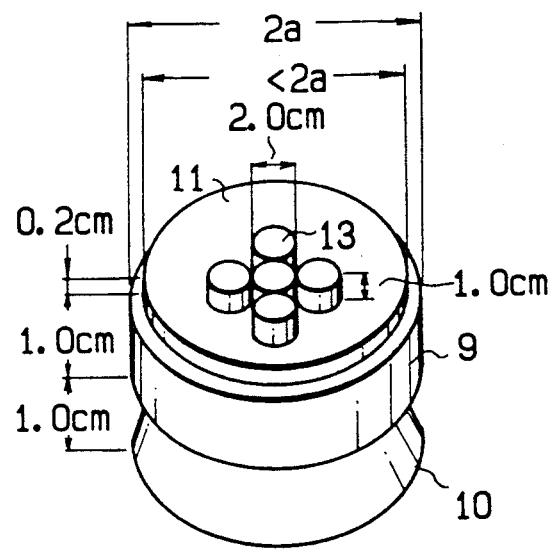
Figure 1L:
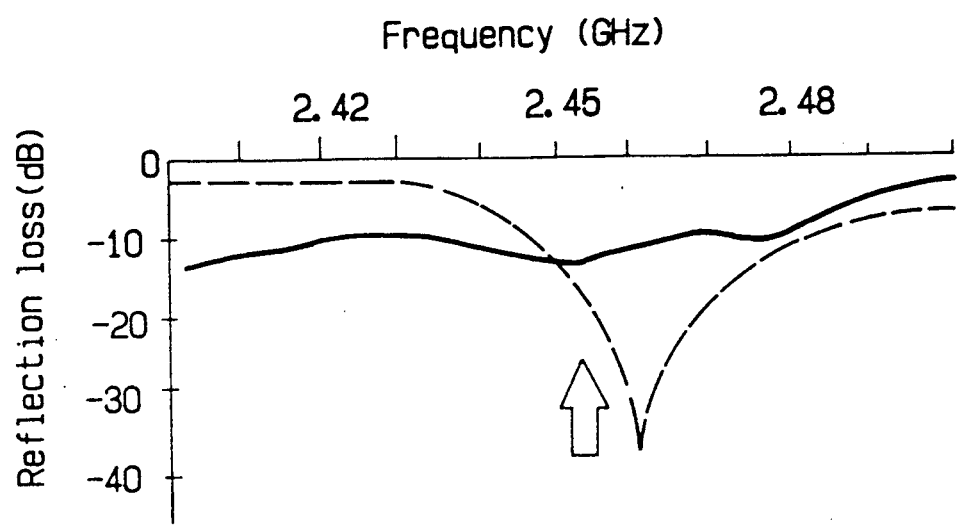

Likewise, the window having five alumina blocks arranged in its center position is shown in FIG. 1(K), and its characteristic is, as shown in FIG. 1(L), such that the reflection loss becomes still larger.

Figure 4A:
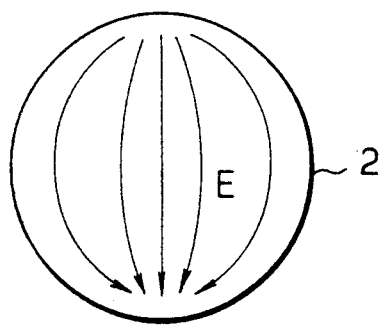
FIG. 4(A) shows a schematic explanatory view of an electric field distribution in a circular $TE_{111}$ resonant mode.
Figure 4B:
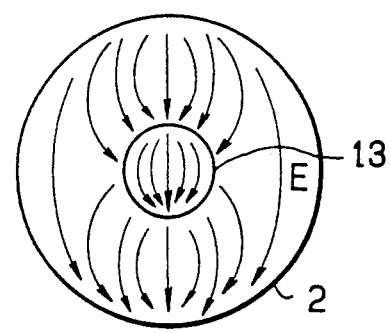
FIG. 4(B) shows that in a coaxial $TE_{111}$ resonant mode.

By the way, in the case of arranging the alumina block 13 in the center position of the window, the $TE_{111}$ resonant mode of the circular window is deformed and becomes close to that of the coaxial line. The changes in the distribution of the electric field at that time are shown in FIG. 4(B). In FIG. 4(A), there is shown the distribution state of the electric field in the known circular $TE_{111}$ mode. In the case of plasmas generated using the window shown in FIG. 4(A), the plasma density becomes high at two places where the electric field converges, and as a result, heat generation in the alumina material of the window eventually becomes large at those places. However, in the case of the window shown in FIG. 4(B), a region having a high density of the electric field is desirably dispersed and because of this, the plasma density becomes nearly uniform. Following this, the heat generation is also dispersed and as a result, damages in the window due to over-heat becomes to hardly occur.

As are stated above, it is possible to appropriately adjust the resonant frequency and electromagnetic mode of the window by arranging a proper alumina plate or block in the way as desired.

Figure 2B:
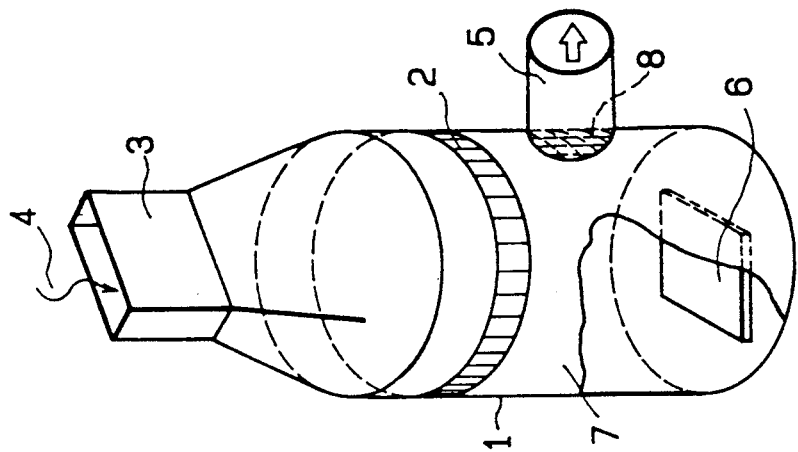
FIGS. 2(A) through 2(C) show schematic perspective views of known apparatuses for the formation of a functional deposited film using MW-PCVD process and show the frequency characteristics of the microwave introducing window therein.
Figure 2A:
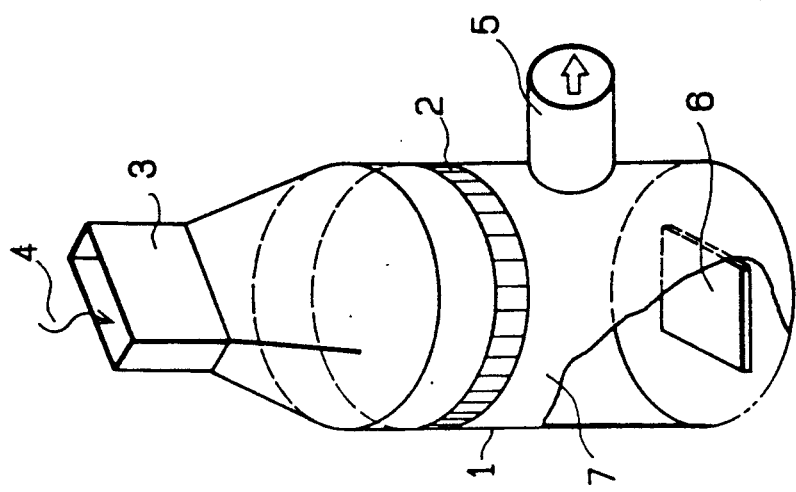
Figure 2C:
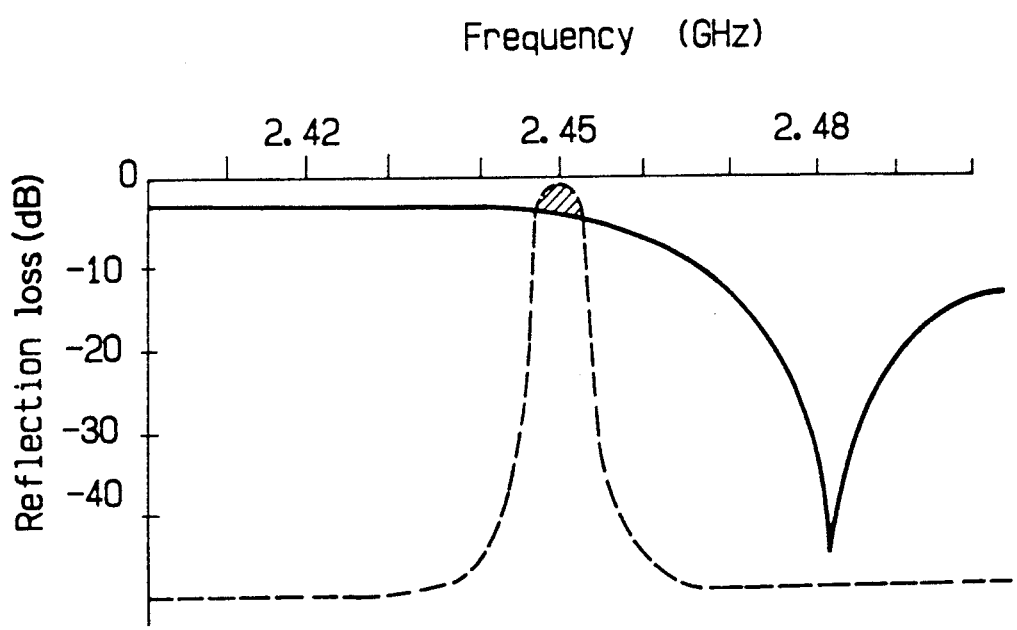
Figure 3A:
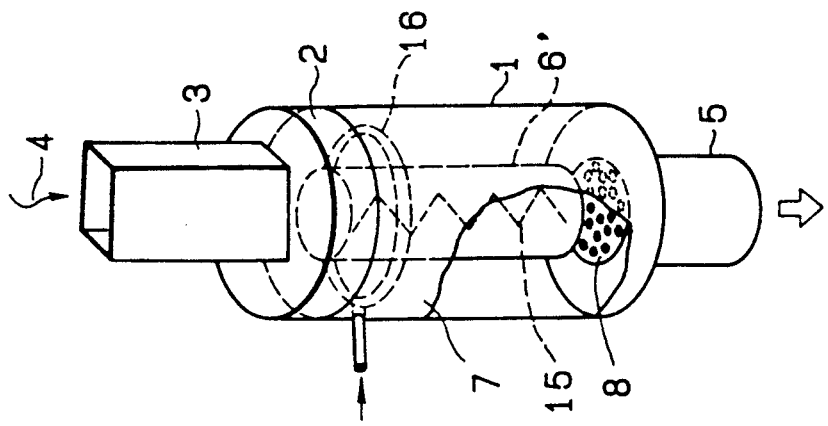
FIGS. 3(A) and 3(B) show schematic perspective views of other known apparatuses for the formation of a functional deposited film using MW-PCVD process.
Figure 3B:
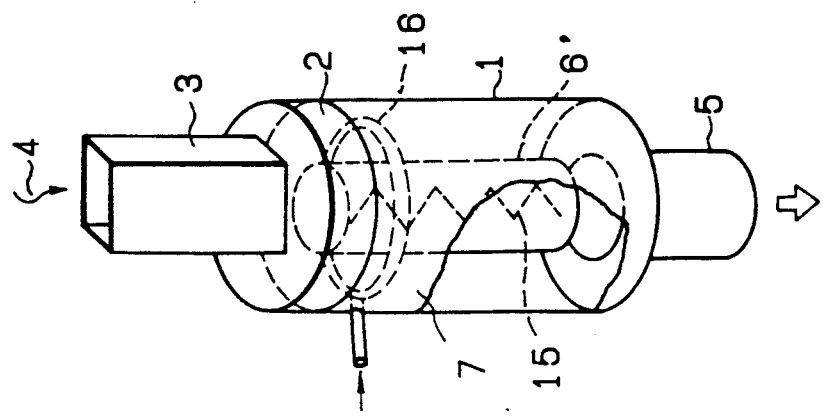

In a preferred embodiment of the microwave introducing window to be employed in the apparatus as shown in FIG. 2(B) for the formation of a functional deposited film using MW-PCVD process using a microwave oscillator having a central frequency of 2.452 GHz, it is preferred to employ a structure of the window as shown in FIG. 1(G) in which the reflection power of microwave became the smallest at this frequency.

In the case of employing other kind of structure for that window the reflection power therein does not become smaller than that in the window shown FIG. 1(G), so that it is not possible to efficiently introduce the microwave power into plasmas.

It should be noted that the reason why the window structure shown in FIG. 1(G) is employed is that the central frequency of the magnetron built in the microwave oscillator employed in this embodiment coincides by chance with the adjustable range of the frequency in the window shown in FIG. 1(G). Anway, it is known that different magnetrons have different central frequencies respectively. Therefore, in the case of the central frequency of the magnetron built in the employed microwave oscillator being 2.46 GHz, the structure of the window shown in FIG. 1(C) is suited to be employed. Likewise, in the case of using the microwave oscillator having a central frequency of 2.43 GHz, the structure of the window shown in FIG. 1(A) is suited to be employed.

In any case, the structure of the window should be appropriately selected depending upon the kind of microwave oscillator to be used.

An example of forming a functional deposited film using the apparatus of the present invention is as follows.

In this example, there was formed a functional deposited film on a substrate using the apparatus shown in FIG. 2(B) which has, as the microwave introducing window 2, the one having the structure shown in FIG. 1(G) using a microwave oscillator having a central frequency of 2.452 GHz.

And, as the raw material gas, there were used silane gas and $H_2$ gas.

Silane gas and $H_2$ gas were introduced through gas supplying means (not shown) into the film forming space 7 respectively at flow rates of 500 SCCM and 200 SCCM and under the vacuum condition of $2 \times 10^{-3}$ Torr. At the same time, there was applied a microwave power of 1 KW having a frequency of 2.45 GHz from the microwave power source. During discharge, there was observed the reflection of a microwave power of 100 W. But, that reflection was recognized that it was caused not because of the alumina window itself but because of the plasmas generated in the film forming space.

And discharge was carried out in a sufficiently stable state and the temperature of the window scarcely change during the film forming operation for an hour.

And, as a result of examining a deposited amorphous silicon film to be formed, it was found that the deposition rate was 150 Å/sec., which is about two fold in comparison with that in the case of employing the conventional microwave introducing window.

Further, as a result of evaluating the resultant deposited film, it was found that in spite of such high deposition rate, it was such desired electric characteristics; the dark conductivity of $6 \times 10^{-12}$ S/cm and the light/dark conductivity ratio being about four figures which are comparable to those of a know desirable one.

By the way, in the above embodiments, explanation has been made chiefly to the circular alumina window resonating with $TE_{11}$ resonant mode.

Figure 5:
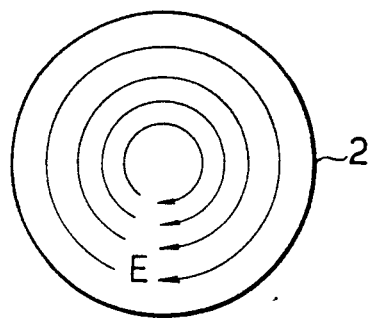
FIG. 5 shows a schematic explanatory view of an electric field distribution in a circular $TE_{01}$ resonant mode.

However, considering the places on which the alumina plates or the alumina blocks are to be arranged are restricted to those affected by the electric field in the window and the resonant conditions are to be adjusted by changing the distribution thereof, it is not necessary for the resonant mode of the window to be restricted only to $TE_{11}$ mode. Because of this, other than those above mentioned, it is possible to use, for example, such circular window of which resonant mode is $TE_{01}$. In that case, however, the electric fields are distributed concentrically as shown in FIG. 5 so that the resonant frequency becomes to shift when said blocks are arranged in the center position and in the circumferencial part thereof.

In the apparatus according to the present invention, by means of a simple work, namely by piling or arranging an appropriate dielectric plate or block properly on a microwave introducing window, the resonant frequency of the microwave introducing window can be desirably shifted to coincide with the oscillation frequency of the microwave power source, which results in remarkably reducing the reflection loss of microwave. Because of this, it becomes possible to efficiently introduce a microwave power into the reaction chamber.

In view of the above, it becomes possible for the apparatus using MW-PCVD process with which a microwave introducing window being provided according to the present invention to form a desired deposited film composed of an amorphous material at high deposition rate.

What is claimed is:

1. In an apparatus for the formation of a functional deposited film using microwave plasma chemical vapor deposition process comprising a substantially enclosed deposition chamber which is provided with a substrate supporting means, a raw material gas feeding means, an exhaust means and a window allowing transmission of microwaves from a microwave power source as a constituent wall member of the deposition chamber, the improvement which comprises a plurality of layers laminated concentrically in the center of the window and in the direction of microwave transmission, each of said layers comprising a microwave transmissible material having a specific inductive capacity of more than 1.0, whereby the laminated window acts as a microwave resonator and provides enhanced microwave transmission.

2. The apparatus according to claim 1, wherein said plurality of layers are comprised of the same microwave transmissible material.

3. The apparatus according to claim 2, wherein said microwave transmissible material is alumina.

4. The apparatus according to claim 2, wherein said microwave transmissible material is alumina ceramic.

5. The apparatus according to claim 1, wherein said plurality of layers are comprised of different microwave transmissible materials.

6. The apparatus according to claim 5, wherein one of said different microwave transmissible materials is alumina and the other is quartz glass.

7. The apparatus according to claim 1, wherein the microwave transmissible material to constitute each of said plurality of layers has a specific inductive capacity of 10.

8. The apparatus according to claim 1, wherein said plurality of layers vary in thickness.

9. The apparatus according to claim 8, wherein the thickness of one of said plurality of layers corresponds to a half wavelength of the microwave used.

10. The apparatus according to claim 1, wherein each of said plurality of layers is shaped in a circular form.

11. The apparatus according to claim 10, wherein the circular layers have different radii.

12. The apparatus according to claim 1, wherein the side wall of one of said plurality of layers is tapered.

13. The apparatus according to claim 1 which further comprises a dielectric plate member being disposed on the upper layer, and said dielectric plate member comprising a microwave transmissible material having a specific inductive capacity of more than 1.0.

14. The apparatus according to claim 13 which further comprises a plurality of dielectric blocks respectively having a small radius being disposed on said dielectric plate member, each of said dielectric blocks comprising a microwave transmissible material having a specific inductance capacity of more than 1.0.

15. The apparatus according to claim 14, wherein said plurality of dielectric blocks are arranged so as to intersect with the electric lines of force of microwave transmission.

16. The apparatus according to claim 15, wherein each of the arranged blocks comprises two dielectric blocks being piled.

17. The apparatus according to claim 1 which further comprises a plurality of dielectric plate members being placed on the upper layer of said plurality of layers, the size of each of said plurality of dielectric plate members being smaller than that of said upper layer, and each of the dielectric plate members comprising a microwave transmissible material having a specific inductive capacity of more than 1.0.

18. The apparatus according to claim 17 which further comprises a plurality of dielectric blocks respectively having a small radius being arranged on the upper dielectric member of said plurality of said dielectric plate members, each of said dielectric blocks comprising a microwave transmissible material having a specific inductive capacity of more than 1.0.

19. The apparatus according to claim 18, wherein said plurality of dielectric blocks are arranged so as to intersect with the electric lines of force of microwave transmission.

20. The apparatus according to claim 19, wherein each of the arranged blocks comprises two dielectric blocks being piled.

21. In an apparatus for the formation of a functional deposited film using microwave plasma chemical vapor deposition process comprising a substantially enclosed deposition chamber which is provided with a substrate supporting means, a raw material gas feeding means, an exhaust means and a window allowing transmission of microwave from a microwaves power source as a constituent wall member of the deposition chamber, the improvement which comprises a plurality of dielectric blocks being arranged in the center of said window to intersect with the electric lines of force of microwave transmission, each of said dielectric blocks having a small radius and comprising a microwave transmissible material having a specific inductive capacity of more than 1.0, whereby said window having said plurality of dielectric blocks acts as a microwave resonator and provides enhanced microwave transmission.

22. The apparatus according to claim 21, wherein said plurality of dielectric blocks are comprised of the same microwave transmissible material.

23. The apparatus according to claim 21, wherein said plurality of dielectric blocks are comprised of different microwave transmissible materials.

24. The apparatus according to claim 21, wherein said plurality of dielectric blocks are arranged as a plurality of layers laminated concentrically in the center and in the direction of microwave transmission, each of said layers comprising a microwave transmissible material having a specific inductive capacity of more than 1.0.

25. The apparatus according to claim 24, wherein said plurality of layers are comprised of the same microwave transmissible material.

26. The apparatus according to claim 25, wherein said microwave transmissible material is alumina.

27. The apparatus according to claim 25, wherein said microwave transmissible material is alumina ceramic.

28. The apparatus according to claim 24, wherein said plurality of layers are comprised of different microwave transmissible materials.

29. The apparatus according to claim 28, wherein one of said different microwave transmissible materials is alumina and the other is quartz glass.

30. The apparatus according to claim 24, wherein the microwave transmissible material to constitute each of said plurality of layers has a specific inductive capacity of 10.

31. The apparatus according to claim 24, wherein said plurality of layers have different thicknesses.

32. The apparatus according to claim 31, wherein the thickness of one of said plurality of layers corresponds to a half wavelength of the microwave used.

33. The apparatus according to claim 24, wherein each of said plurality of layers is shaped in a circular form.

34. The apparatus according to claim 33, wherein the circular layers have different radiuses.

35. The apparatus according to claim 24, wherein the side wall of one of said plurality of layers is tapered.

36. The apparatus according to claim 24 which further comprises a dielectric plate member being disposed on the upper layer of said plurality of layers, the size of said dielectric plate member being smaller than that of said upper layer, and said dielectric plate member comprising a microwave transmissible material having a specific inductive capacity of more than 1.0.

37. The apparatus according to claim 24, wherein each of the arranged blocks comprises two dielectric blocks being piled.

* * * * *

UNITED STATES PATENT AND TRADEMARK OFFICE
CERTIFICATE OF CORRECTION

PATENT NO. : 5,038,712
DATED : August 13, 1991
INVENTOR(S) : YASUTOMO FUJIYAMA

Page 1 of 3

It is certified that error appears in the above-identified patent and that said Letters Patent is hereby corrected as shown below:

On the Title page:

IN [56] REFERENCES CITED

OTHER PUBLICATIONS, "Grat," should read --Graf,--.
Attorney, Agent, or Firm: "Fitzpatrick, Cella Harper
    & Scinto" should read --Fitzpatrick, Cella,
    Harper & Scinto--.

COLUMN 1

Line 30, "atom" should read --atoms--.

COLUMN 2

Line 3, "about" should be deleted.
Line 32, "place" should read --placed--.
Line 49, "follow" should be deleted.
Line 61, "can not" should read --cannot--.

COLUMN 3

Line 42, "int he" should read --in the--.
Line 45, "self-exited," should read --self-excited,--.
Line 47, "are necessary" should read --need--.
Line 58, "becomes" should read --become--.

COLUMN 4

Line 4, "follows;" should read --follows.--.
Line 11, "resonator;" should read --resonator:--.
Line 19, ""e"" should read --"$\epsilon$"--.
Line 49, "GHz" should read --GHz.--.

UNITED STATES PATENT AND TRADEMARK OFFICE
CERTIFICATE OF CORRECTION

PATENT NO. : 5,038,712
DATED : August 13, 1991
INVENTOR(S) : YASUTOMO FUJIYAMA

It is certified that error appears in the above-identified patent and that said Letters Patent is hereby corrected as shown below:

COLUMN 4

Line 60, "such that" should read --that which--.
Line 65, "rest" should read --remaining--.
Line 67, "as" should be deleted.

COLUMN 5

Line 1, "is" should be deleted.
Line 12, "are" should read --is--.
Line 23, "$\epsilon$" should read --$\bar{\epsilon}$--.
Line 47, "make" should read --makes--.
Line 52, "finding" should read --find--.
Line 61, "piling," should read --piling--.

COLUMN 6

Line 58, "pilled" should read --piled--.
Line 65, "Further more," should read --Furthermore,--.

COLUMN 7

Line 24, "mode;" should read --mode.--.
Line 43, "being" should read --is--.
Line 49, "angle O," should read --angle $\theta$,--.

COLUMN 8

Line 25, "where" should be deleted.
Line 57, "becomes to" should be deleted.
Line 58, "are" should be deleted.

UNITED STATES PATENT AND TRADEMARK OFFICE
CERTIFICATE OF CORRECTION

PATENT NO. : 5,038,712
DATED : August 13, 1991
INVENTOR(S) : YASUTOMO FUJIYAMA

Page 3 of 3

It is certified that error appears in the above-identified patent and that said Letters Patent is hereby corrected as shown below:

COLUMN 9

Line 3, "other" should read --another--.
    Line 51, "change" should read --changed--.
    Line 54, "two fold" should read --twofold--.
    Line 59, "was" should read --has--.
    Line 61, "are" should read --is--.
    Line 62, "know" should read --known--.

COLUMN 10

Line 9, "becomes to shift" should read --shifts--.
    Line 10, "circumferencial" should read --circumferential--.

COLUMN 11

Line 17, "inductance" should read --inductive--.
    Line 53, "microwave" should read --microwaves-- and --microwaves" should read --microwave--.

Signed and Sealed this

Sixth Day of April, 1993

Attest:

STEPHEN G. KUNIN

Attesting Officer     Acting Commissioner of Patents and Trademarks